United States Patent [19]

Wang

[11] Patent Number: 4,878,154
[45] Date of Patent: Oct. 31, 1989

[54] CONTROL BODY FOR CHRISTMAS TREE

[76] Inventor: Kwang N. Wang, 2F, No. 1 Lane 76, An-Ho Rd., Taipei, Taiwan

[21] Appl. No.: 288,679

[22] Filed: Dec. 22, 1988

[51] Int. Cl.$^4$ .............................................. H05K 1/14
[52] U.S. Cl. .................................... 361/395; 200/292; 200/51 R; 338/200
[58] Field of Search ...................... 200/292, 303, 51 R, 200/11 DA; 338/172, 200, 215; 361/380, 395, 399, 400, 428, 331

[56] References Cited

U.S. PATENT DOCUMENTS

| | | | |
|---|---|---|---|
| 4,131,771 | 12/1978 | Erickson | 200/11 DA |
| 4,698,552 | 10/1987 | Minami | 361/399 |
| 4,703,397 | 10/1987 | Minokra | 361/399 |
| 4,723,196 | 2/1988 | Hofmeister | 361/399 |

Primary Examiner—Gerald P. Tolin
Attorney, Agent, or Firm—A. C. Smith

[57] ABSTRACT

A control body includes a circuit board, a housing having three engaging sets and a base having electric wire guiding grooves each of which includes three spaced radially arcuate platelets, a cover plate having three pairs of barbed legs respectively engaging with the three engaging sets, an end cover, a switch disk, a coupling piece, and a rotating disk so that the control body can be closed though a mechanically engaging style to have a water-proof effect.

1 Claim, 3 Drawing Sheets

CONTROL BODY FOR CHRISTMAS TREE

BACKGROUND OF THE INVENTION

The present invention relates to a control body for a Christmas tree, and more particularly to one having a water-proof effect.

There are numerous structurally different designs for the control body for the Christmas tree. It is generally used by those known designs that an adhesive adheres together two housing halves in order to impart a water-proof capability to the control body. The adhering procedure, however, is time-consuming and the adhering effect is always not ideal that the moisture or the water can penetrate into the control body along the electric wire to thus damage the electronic elements on the circuit board therein.

It is therefore attempted by the applicant to deal with the above shortcomings encountered by the prior art.

SUMMARY OF THE INVENTION

It is therefore an object of the present invention to provide a control body for a Christmas tree which has the housing and the cover plate thereof closed through a mechanically engaging style instead of an adhesive.

It is further an object of the present invention to provide a control body in which the housing and the cover plate can be effectively engaged together rapidly and easily.

It is additional an object of the present invention to provide a control body having electric wire guiding grooves to secure that no water can penetrate into the control body along the electric wires.

According to the present invention, a control body includes a circuit board, a housing having three engaging sets and a base plate having electric wire guiding grooves each of which includes three spaced radially arcuate platelets, a cover plate having three pairs of barbed legs respectively engaging with the three engaging sets, an end cover, a switch disk, a coupling piece, and a rotating disk.

The present invention may best be understood through the following description with reference to the accompanying drawings, in which:

DETAILED DESCRIPTION OF THE PREFERRED EMBODIMENT

Figure 4:
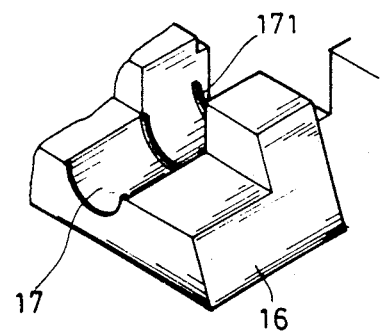
FIG. 4 is an enlarged schematic view showing an electric wire guiding groove of a base plate of the housing of a control body in FIG. 1.

Referring now to the drawings, a control body for a Christmas tree according to the present invention includes a housing 1, a cover plate 5, an end cover 6, a switch disk 2, a rotating disk 3, and a circuit board 4. Housing 1 receives therein circuit board 4 and includes a peripheral flange 11, a plug seat 12 mounting thereon two conducting pieces 13, a bottom hole 14, an annulus 15 coaxial with hole 14 and regularly forming thereon a knurled surface, a base plate 16 extended from one end of housing 1 and forming thereon a plurality of electric wire guiding grooves 17 each of which, as shown in FIG. 4, is provided with three spaced radially arcuate platelets 171, and three engaging sets each of which includes two opposite higher triangular pieces 18 and a lower triangular piece 19.

Switch disk 2 having a rotating medium 21 includes a barded piece 21 engaging with a disk 23 having actuating pin 24 in housing 1 in order to adjust the contacting relationship between circuit board 4 and conducting pieces 13.

Rotating disk 3 having a barbed piece 31 engages through bottom hole 14 with a coupling piece 32 which is in housing 1 and includes an adjusting rod 34 engaging with a rheostat on circuit board 4 for changing the frequency and two opposite engaging pieces 33 also being knurled in the manner that they can steppedly and diametrically engage with the knurled surface of annulus 15.

Figure 1:
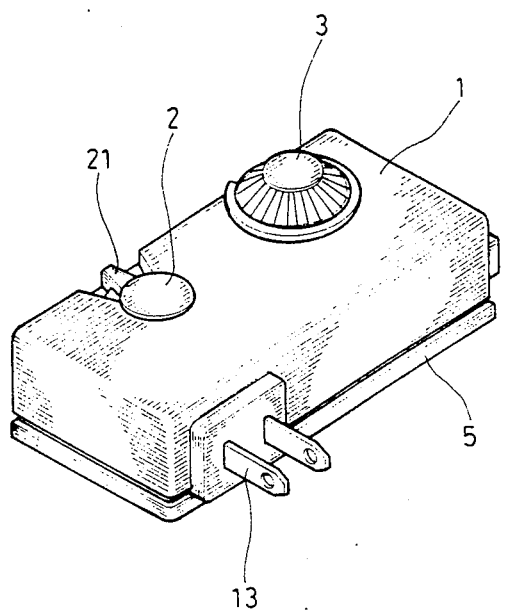
FIG. 1 is a perspective view showing a preferred embodiment of a control body for a Christmas tree according to the present invention.
Figure 2:
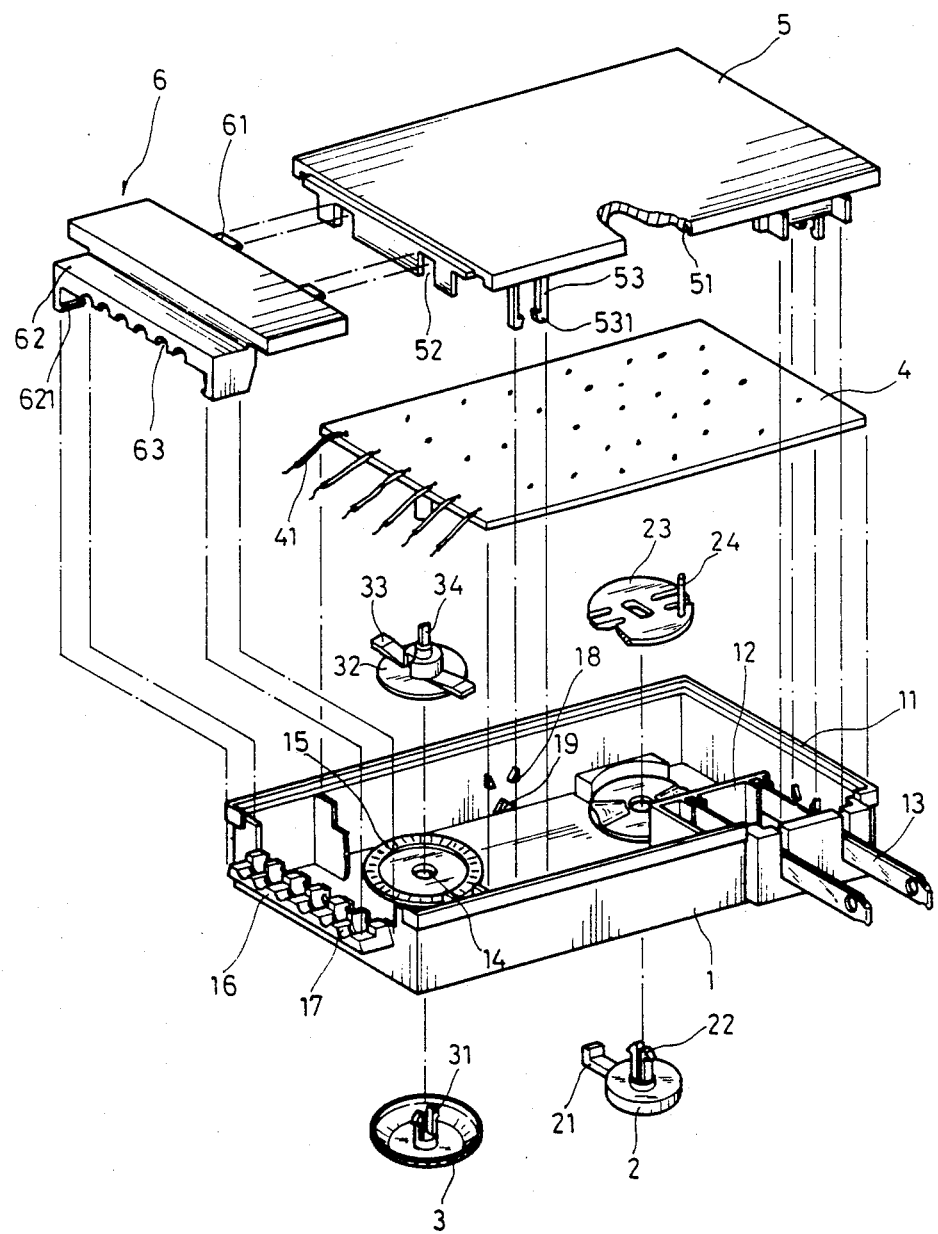
FIG. 2 is an exploded view of a control body in FIG. 1.
Figure 3:
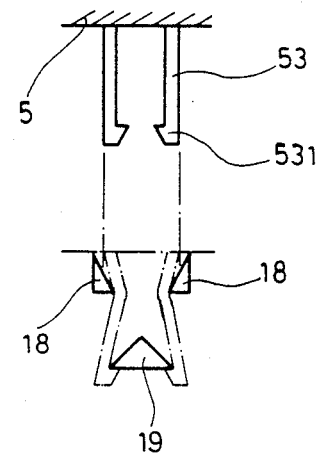
FIG. 3 is a schematic view showing an engagement between an engaging set of the housing and a pair of barbed legs of the cover plate of a control body in FIG. 1.

Cover plate 5 includes a bottom groove 51 capable of tightly fitting therein peripheral flange 11, two end recesses 52, and 3 pairs of legs 53 having facing barbs 531 each pair of which, as shown in FIG. 3, when pressed against the respective engaging set of housing 1, first has two legs 53 thereof inwradly inclined and then has the two legs 53 outwardly diverged along the two inclined sides of triangular piece 19 to allow finally barbs 531 hooking on the bottm of triangular piece 19. Thereafter, it will be impossible to detach cover plate 5 from housing 1 without the structure being ruined which is advantageous in some instance.

End cover 6 includes two projections 61 capable of being tightly engaged in recesses 52, and a covering portion 62 which includes two end hooks 621 capable of tightly engaging with base plate 16 and is provided thereunder with a plurality of electric wire guiding grooves 63 respectively corresponding and identical to and cooperating with guiding grooves 17 to form a plurality of cylindrical holes for passing therethrough and firmly engaging therein electric wires 41 by the engagement of platelets 171 and the insulating coatings of wires 41 so that it will be possible no more that the water will penetrate into housing 1 along the electric wires.

Through the above description, it should now be readily apparent that the present invention has a simple structure, a good water-proof effect and an improved safety and can be manufactured time-effectively and assembled in a more convenient manner.

What I claim is:

1. A control body for a Christmas tree comprising:
   a circuit board having a rheostat;
   a housing receiving therein said circuit board and including:
      a plug seat mounting thereon two conducting pieces;
      three engaging sets each of which includes two opposite higher triangular pieces and a lower triangular piece;
      a base plate extended from one end of said housing and forming thereon a plurality of electric wire guiding grooves each of which is provided with three spaced radially arcuate platelets; and an annulus formed on an inner wall of said housing and regularly forming thereon a knurled surface;

a cover plate having three pairs of barbed legs each pair of which is capable of firmly engaging with said higher and lower triangular piece of said each set;

an end cover connected to said cover plate, and having a covering portion capable of being securely fixed to said base plate and providing thereunder a plurality of guiding grooves respectively corresponding to said electric wire guiding grooves;

a switch disk engaging with said housing for adjusting a contacting relationship between said circuit board and said conducting pieces; a coupling piece received in said housing, connected to said rheostat and including two opposite engaging pieces capable of steppedly and diametrically engaging on said knurled surface; and a rotating disk positioned outside of said housing and capable of firmly engaging with said coupling piece.

* * * * *